(12) United States Patent
vanRuymbeke et al.

(10) Patent No.: US 7,889,471 B2
(45) Date of Patent: Feb. 15, 2011

(54) POWER SUPPLY PARTICULARLY FOR A METER-BUS

(75) Inventors: Gilles vanRuymbeke, Menlo Park, CA (US); Andrew Robinson, Los Gatos, CA (US)

(73) Assignee: Echelon Corporation, San Jose, CA (US)

( * ) Notice: Subject to any disclaimer, the term of this patent is extended or adjusted under 35 U.S.C. 154(b) by 558 days.

(21) Appl. No.: 11/399,050

(22) Filed: Apr. 5, 2006

(65) Prior Publication Data
US 2007/0236839 A1 Oct. 11, 2007

(51) Int. Cl.
*H02H 3/06* (2006.01)
*H02H 9/02* (2006.01)
(52) U.S. Cl. .................. 361/59; 361/93.1; 361/93.4; 361/93.7; 361/94
(58) Field of Classification Search ........... 361/59, 361/93.1, 93.4, 93.7, 94
See application file for complete search history.

(56) References Cited

U.S. PATENT DOCUMENTS

| | | | | |
|---|---|---|---|---|
| 3,845,373 A | * | 10/1974 | Totsu et al. | 318/434 |
| 4,851,743 A | * | 7/1989 | Schmerda et al. | 388/811 |
| 7,113,379 B2 | * | 9/2006 | Matsumoto | 361/57 |
| 2006/0234382 A1 | * | 10/2006 | Wang et al. | 436/39 |

OTHER PUBLICATIONS

European Standard, EN 13757-2, Communication systems for and remote reading of meters - Part 2: Physical and link layer; Nov. 2004, European Committee for Standardization.
European Standard, EN 13757-3, Communication systems for and remote reading of meters - Part 3: Dedicated application layer; Nov. 2004, European Committee for Standardization.

* cited by examiner

*Primary Examiner*—Stephen W Jackson
*Assistant Examiner*—Zeev Kitov
(74) *Attorney, Agent, or Firm*—Blakely, Sokoloff, Taylor & Zafman LLP

(57) ABSTRACT

A power supply providing current interruption based on the energy from the supply over a sliding window of time is disclosed. The output current from the supply is periodically reestablished.

12 Claims, 2 Drawing Sheets

POWER SUPPLY PARTICULARLY FOR A METER-BUS

FIELD OF THE INVENTION

The invention relates to the field of power supplies, particularly fault tolerant power supplies.

PRIOR ART AND RELATED ART

A standardized serial bus system for the remote reading of meters and various sensors, has been adopted in Europe. The so-called meter-bus or M-BUS permits, for instance, a power meter to act as a master/gateway for other household meters such as gas and water meters. The M-BUS interconnects the master (e.g. power meter) with the slaves (e.g. gas and water meters). Other sensors such as temperature sensors and actuators to, for example, shed electrical loads, may also be coupled to the M-BUS. The physical and link layer of the M-BUS is set forth in EN 13757-2 and the application layer in EN13757-3.

The implementation of physical layer presents several challenges especially in the design of a fault tolerant power supply and a receiver. These are discussed in connection with FIGS. 1 and 2.

SUMMARY OF THE INVENTION

A fault tolerant power supply is described. A sensing circuit senses the output current. A switching circuit, coupled to the sensing circuit, has an off state during which the flow of output current is interrupted. A feedback path in the switching circuit reinforces the off state once a predetermined criteria in the current is met. This stabilizes the off state and prevents jittering between the off and on states when, for instance, the output current is varying near a maximum output current. The power supply includes a circuit to try reestablishing the output current after a period of time.

DETAILED DESCRIPTION

A fault tolerant power supply particularly suited for M-BUS is described. In the following description, numerous specific details are set forth, for instance, in the schematic of FIG. 4, a specific configuration with specific values for resistors and capacitors as well as specific transistors is set forth. It will be appreciated that these details are used to provide a thorough understanding of the present invention, and other circuit configuration and values may be used within the scope of the present invention.

Figure 1:
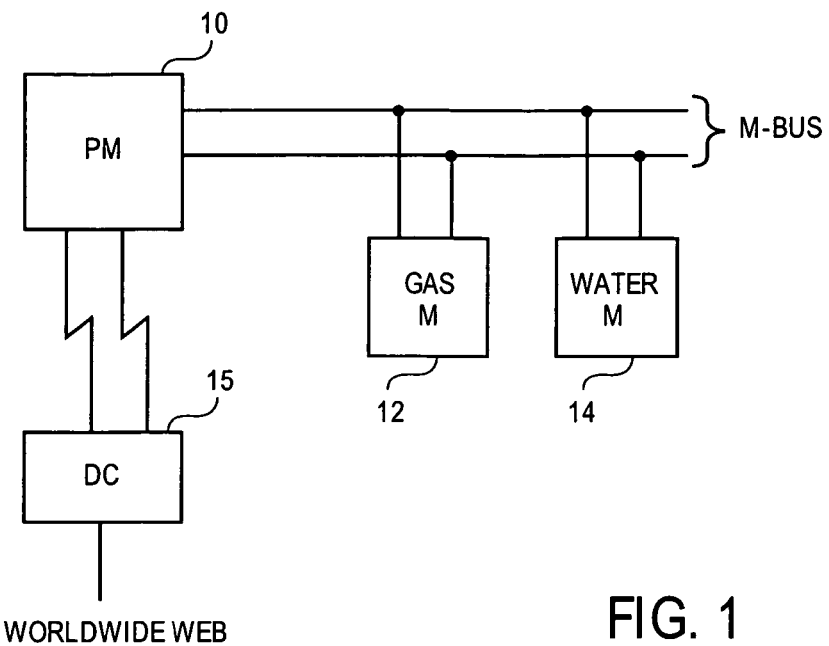
FIG. 1 is an overall block diagram of an M-BUS and a power meter's gateway connection.

FIG. 1 illustrates a typical arrangement in which the M-BUS is used. A power meter 10, which is a master under the M-BUS standard, communicates with several slaves such as a gas meter 12 and a water meter 14. As mentioned earlier, sensors, actuators, and other devices may be coupled to the M-BUS. The power meter 10, for instance, may poll the gas and water meters to obtain readings over the M-BUS. Several power meters 10 may be coupled to a data concentrator 15 over an RF or IR link, or a hard-wired link. Data concentrators, then may communicate with a central station over, for example, the Internet. Alternatively, the power meter 10 may communicate directly over the Internet with a central station. The meter 10 may communicate not only its own readings but those of the other meters on the M-BUS, and may receive instructions which are communicated to the slaves on the M-BUS. In this manner, the power meter 10 acts as a gateway.

Figure 2:
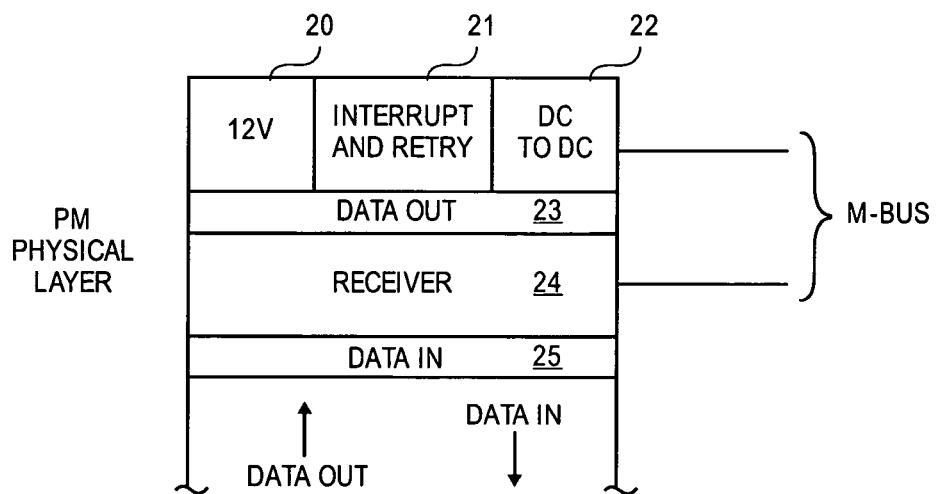
FIG. 2 is a general block diagram showing the physical layer in the power meter for the M-BUS.

Referring to FIG. 2, the physical layer portion of the power meter is shown in block diagram form. The M-BUS may be ordinary conductors such as a twisted pair. In the M-BUS standard, one line is at +36 V with respect to the other line. Power for the slaves is drawn from the M-BUS. Data is transmitted from the master to the slaves by modulating the voltage on the power line from 36 volts to 24 volts. A logical "1" (referred to as a "mark") is represented by the condition of the lines being at 36 volts. A logical "0" (referred to as a "space") is represented by the reduction of the lines to 24 volts. For an embodiment of the present invention, the ground line is changed by 12 volts (0 for "space" or 12V for "mark") to signal a space.

Information is sent from the slaves to the master by modulating the current consumed by the transmitting slave. When no slave is sending a space, a constant current is drawn from the master corresponding to the total quiescent current of all the slaves. A logical "1" or mark transmitted by a slave is represented by a constant current of up to 1.5 mA. A logical "0" or space is represented by the flow of an additional 11-20 mA. As currently implemented, the M-BUS standard utilizes only half duplex transmissions on the bus, and consequently, transmission is either from master-to-slave or slave-to-master, but not both at the same time.

In FIG. 2, the physical layer of the M-BUS is implemented with a 12 volt power supply 20, an interrupt and retry circuit 21 and a DC-to-DC converter 22. The 12 volt supply is stepped up to 24 volts for one line of the bus. The other line of the bus is modulated between 0 and 12 volts for the transmission of data from the master. These voltages are different from those specified in the standard, but it will be appreciated that the circuits described in this application are applicable to the specific voltages described in the standard, and that the selection of a particular voltage is somewhat arbitrary. The data transmitted from the power meter of FIG. 2 is represented by the block 23, adjacent the power supply, to indicate that one line of the power supply is modulated to provide the mark and space for the master-slave direction.

One desirable quality of the power supply for the M-BUS is fault tolerance. For instance, if a short occurs on the bus, the current supplied by the power supply should be interrupted, and the power supply should retry providing power periodically to see if the fault has been cleared.

The M-BUS standard requires that each of the slaves have a current limiting resistor at its input of approximately 430 ohms. This limits the current in the event of a short within a slave to a maximum of 100 mA. A challenge in the receiver design is to sense data from one slave while another is experiencing a short. The receiver must be able to discern the mark and space both in the presence of a low current flow (no short) and a high current flow (slave experiences short). These modulation extremes span two orders of magnitude. Moreover, communications can take place at baud rates from 300-9600 Baud.

Figure 3:
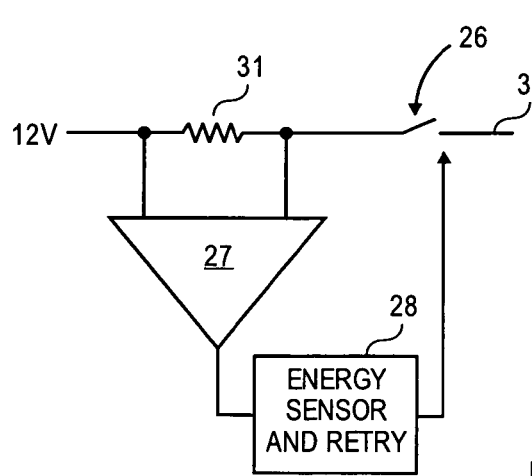
FIG. 3 is a block diagram of a fault tolerant power supply particularly suited for an M-BUS.
Figure 4:
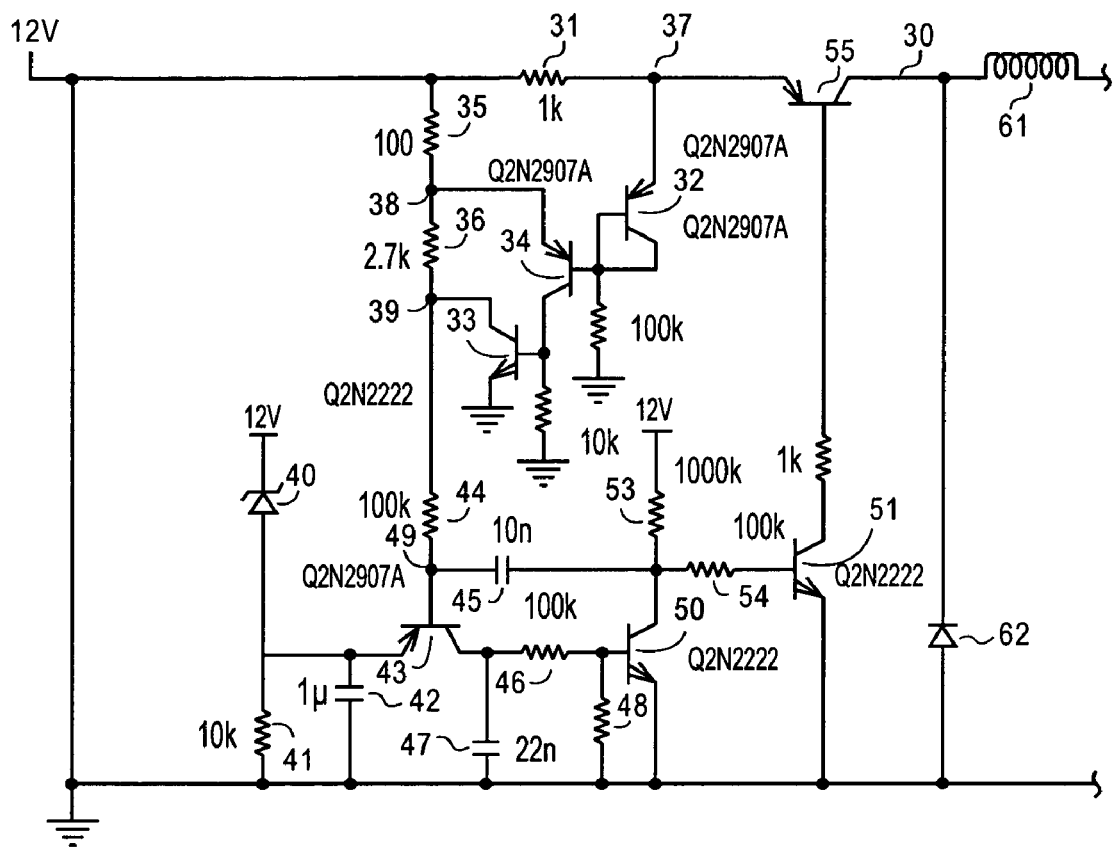
FIG. 4 is a schematic drawing of an embodiment of the power supply of FIG. 3.

The interrupt and retry circuit 21 of FIG. 2 is shown in FIGS. 3 and 4. FIGS. 3 and 4 do not contain the 0 and 12 volt modulation circuitry for the master-to-slave data flow, or the DC-to-DC converter 22 of FIG. 2. Rather, they provide 12 volts on line 30 with respect to ground, and provide the fault tolerant and retry feature for the M-BUS power supply.

In the block diagram of FIG. 3, a 12 volt power supply supplies power on line 30 through a shunt resistor 31. The current through the resistor 31 is sensed by the amplifier 27. The output of the amplifier is connected to an energy sensor and retry circuit 28. As will be seen in more detail in conjunction with FIG. 4, when the energy provided on line 30 during the period of sliding window exceeds a predetermined amount, the switch 26 opens. This interrupts the power to the bus when, for instance, the short occurs across the bus.

Periodically, the switch 26 is closed and current is again allowed to flow through the shunt resistor 31 to determine, for example, if the fault on the bus has been cleared. If the fault has not been cleared, then the switch 26 again opens as a result of the signal from the energy sensor and retry circuit 28.

The circuit of FIG. 4 includes a sensing circuit for sensing the current provided on line 30. The circuit generally comprises a shunting resistor 31, transistors 32, 33 and 34 and the resistors 35 and 36. The circuit of FIG. 4 also includes a switching circuit, which interrupts the flow of current through the transistor 55. The transistor 55 is generally controlled through the transistors 43, 50 and 51. There is also a RC constant associated with the capacitor 47 and resistor 46 which determines retry or off time. The capacitor 45, as will be discussed, provides a feedback path to stabilize the off state of the transistor 55. Also the capacitor 45 and resistor 44 provide a sliding window which integrates the output current. The output current, as will be seen, is represented as a voltage at node 39. It is the energy within the time covered by the window that is actually monitored at node 49.

The sensing circuit referenced to Vcc=12V comprises an operational amplifier implemented with the transistors 32, 33 and 34. The negative input to the amplifier is the emitter of the PNP transistor 34 (node 38) which is coupled to the 12 volt supply through resistor 35. The positive input to the amplifier is node 37, the emitter of the transistor 32. Transistors 32 acts as a diode to provide a bias voltage in conjunction with a 100K resistor for offset. Negative feedback from the output node 39 to the input node 38 is provided through the resistor 36.

In operation, the magnitude of the current flow in line 30 is sensed as it passes through the shunting resistor 31. Consequently, as current flows, the input node 37 is less positive relative to the other input node 38. The drop across the shunt resistor 31 is amplified to provide an output voltage on the node 39. The gain of the amplifier is determined by the ratio of the sum of resistances of resistors 35 and 36 divided by the resistances of the resistor 35. For the illustrated embodiment, this is 28.

The output of the amplifier from node 39 is coupled to the base of the transistor 43 through the resistor 44. The emitter of transistor 43 receives a reference potential developed by the Zener diode 40 and the resistor 41 and filtered by the capacitor 42. When the voltage on node 49 reaches a predetermined potential, transistor 43 conducts, thereby causing transistor 50, through resistor 46, to also be turned on. This in turn, through resistor 54, which is coupled to the base of transistor 5 1, causes transistor 51 to turn off. When transistor 51 turns off, transistor 55 ceases to conduct. Consequently, transistor 55 switches from its on state or its off state once transistor 51 stops conducting.

During normal operation, when the current through the resistor 31 is within its accepted range, there is not sufficient voltage on node 49 to cause transistor 43 to conduct. Thus, during normal operation the transistor 50 is off and transistors 51 and 55 are conducting. As the voltage on the node 49 decreases, for example, in response to a short on the M-BUS, the potential on node 49 decreases to the point that transistor 43 conducts. When transistor 43 initially begins to conduct, as mentioned, transistor 50 conducts. This causes current to flow through resistor 53 and the potential on the collector of transistor 50 to suddenly drop. This drop in potential is fed back to node 49 through the capacitor 45. The feedback causes node 49 to drop, reinforcing the on state of transistor 43 and consequently, the off state of transistor 55. This feedback stabilizes the off state of transistor 55 and assures there is no jitter when the current through the resistor 31 is close to, or varying around, the maximum acceptable current.

When the M-BUS is initially powered up, it may have significant capacitance and the current through the resistor 31 may quickly, but momentarily rise. The capacitor 45 prevents the voltage at node 49 from rising too quickly. Thus, the time constant associated with resistor 44 and capacitor 45 controls how quickly node 49 rises and how tolerant the circuit of FIG. 4 is to a momentary surge of current, for instance, on start-up. If the current through the resistor 31 continues at a high level, then the node 49 will rise as capacitor 45 charges, until finally the transistor 43 conducts. Thus as mentioned, it is the power output of the supply integrated over the period of the sliding window (i.e. energy) which causes interruption not just the magnitude of the output current.

When transistor 43 conducts, it charges capacitor 47 which causes transistor 50 to conduct. This turns off transistor 55 through transistor 51. Capacitor 47 then discharges through resistor 46 and the base-emitter junction of transistor 50. As capacitor 47 drops in potential, it forces transistor 50 off. Then transistor 51 conducts again, in turn causing transistor 55 to conduct. This causes a retry by the power supply. Note, the off period before the retry is a different period than that of the sliding period for determining the output energy from the supply.

The transitions from off-to-on and from on-to-off of the transistor 55 are as short as possible. This is to avoid conduction and dissipation of energy in the transistor. Ideally, transistor 55 should be fully on (saturated) or fully off.

The inductor 61 limits the slope of the current rise. The diode 62 prevents a negative voltage from occurring across the transistor 55.

Thus, a power supply, particularly suited for an M-BUS has been disclosed.

What is claimed is:

1. A fault tolerant power supply comprising:
   a sensing circuit for sensing the power output integrated over a sliding period of time, the period of time being determined by a first RC circuit having a capacitor;
   a switching circuit having an on state and an off state for interrupting the flow of the output current when the power output integrated over the sliding period of time exceeds a predetermined level, the switching circuit having a feedback path directed through the capacitor to reinforce the off state once the predetermined level is reached, so as to stabilize the off state, the switching circuit being coupled to the sensing circuit; and
   a second RC circuit for causing the switch circuit to reestablish the output current after a second period of time, the second RC circuit being coupled to the switching circuit.

2. The power supply of claim 1, wherein the sliding period of time and second period of time are different.

3. The power supply of claim 1, wherein the sensing circuit includes a shunting resistor through which the output current flows.

4. The power supply of claim 1, wherein the second RC circuit defines a second RC time constant which periodically causes the switching circuit to reestablish the output current after the second period of time.

5. The power supply of claim 4, wherein the sensing circuit includes an operational amplifier coupled across a shunting resistor through which the output current flows.

6. A fault tolerant power supply comprising:
sensing means for sensing a predetermined energy output over a sliding window of time, wherein the sensing means includes a first RC circuit;
switching means for interrupting an output current flow from the power supply upon sensing the predetermined energy output, coupled to the sensing means;
feedback means coupled to the switching means for stabilizing the switching means when it interrupts the output current flow, wherein the first RC circuit includes a capacitor which provides a feedback path for the feedback means; and
retry means for causing the power supply to reestablish current flow after the interruption of current.

7. The power supply of claim 6, wherein the sensing means includes a shunt resistor through which the output current flows and an operational amplifier coupled to the shunt resistor.

8. The power supply of claim 6, wherein the retry means includes a second RC circuit.

9. A method of operating a power supply comprising:
determining the energy output from the power supply over a sliding window of time by charging and discharging a capacitor;
interrupting output current from the power supply when the charge on the capacitor exceeds a predetermined level;
reinforcing the interruption of current to stabilize a power off state by providing a feedback signal through the capacitor; and
reestablishing the output current after a predetermined condition.

10. The method of claim 9, wherein the predetermined condition is the passage of a predetermined period of time.

11. The method of claim 9, wherein the determining step includes:
sensing the current through a shunting resistor; and
integrating a signal representative of the current through the shunting resistor on the capacitor.

12. A system comprising:
an M-BUS;
a power supply coupled to the M-BUS for supplying power to devices coupled to the M-BUS;
a data transmitter coupled to the power supply for modulating the output power from the power supply to transmit data to the devices; and
a control circuit coupled to the power supply comprising:
a sensing circuit for sensing the power output integrated over a sliding period of time, the period of time being determined by a first RC circuit having a capacitor;
a switching circuit having an on state and an off state for interrupting the flow of the output current when the power output integrated over the sliding period of time exceeds a predetermined level, the switching circuit having a feedback path directed through the capacitor to reinforce the off state once the predetermined level is reached, so as to stabilize the off state, the switching circuit being coupled to the sensing circuit; and
a second RC circuit for causing the switch circuit to reestablish the output current after a second period of time, the second RC circuit being coupled to the switching circuit.

* * * * *